(12) United States Patent
Paulus et al.

(10) Patent No.: US 7,868,430 B2
(45) Date of Patent: Jan. 11, 2011

(54) SEMICONDUCTOR DEVICE

(75) Inventors: Stefan Paulus, Zeitlarn (DE); Manfred Fries, Hunderdorf (DE); Martin Petz, Hohenkammer (DE); Thomas Mueller, Lappersdorf (DE)

(73) Assignee: Infineon Technologies AG, Neubiberg (DE)

( * ) Notice: Subject to any disclaimer, the term of this patent is extended or adjusted under 35 U.S.C. 154(b) by 34 days.

(21) Appl. No.: 12/238,468

(22) Filed: Sep. 26, 2008

(65) Prior Publication Data

US 2010/0078796 A1 Apr. 1, 2010

(51) Int. Cl.
*H01L 29/72* (2006.01)
(52) U.S. Cl. .................. 257/668; 257/787; 438/64; 438/106; 438/112; 438/124; 438/127
(58) Field of Classification Search ................. 257/668, 257/787; 438/64, 106, 112, 124, 127
See application file for complete search history.

(56) References Cited

U.S. PATENT DOCUMENTS

| | | | |
|---|---|---|---|
| 5,683,944 A | 11/1997 | Joiner et al. | |
| 6,159,764 A | 12/2000 | Kinsman et al. | |
| 6,215,175 B1 | 4/2001 | Kinsman | |
| 2001/0007780 A1* | 7/2001 | Minamio et al. | 438/106 |
| 2003/0020147 A1* | 1/2003 | Kobayakawa et al. | 257/666 |
| 2003/0042583 A1 | 3/2003 | Chen et al. | |
| 2004/0099933 A1 | 5/2004 | Kimura | |
| 2008/0036067 A1* | 2/2008 | Lin | 257/686 |
| 2009/0162965 A1* | 6/2009 | Abela | 438/64 |

* cited by examiner

*Primary Examiner*—Edward Wojciechowicz
(74) *Attorney, Agent, or Firm*—Infineon Technologies AG Patent Department

(57) ABSTRACT

This application relates to a semiconductor device comprising multiple separate leads molded in a molded structure, and a chip attached to the molded structure over at least two of the multiple separate leads.

17 Claims, 3 Drawing Sheets

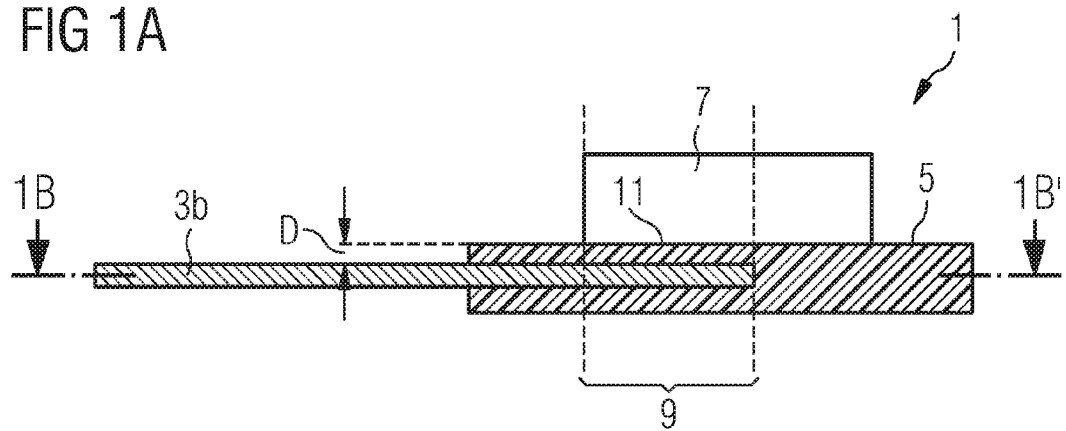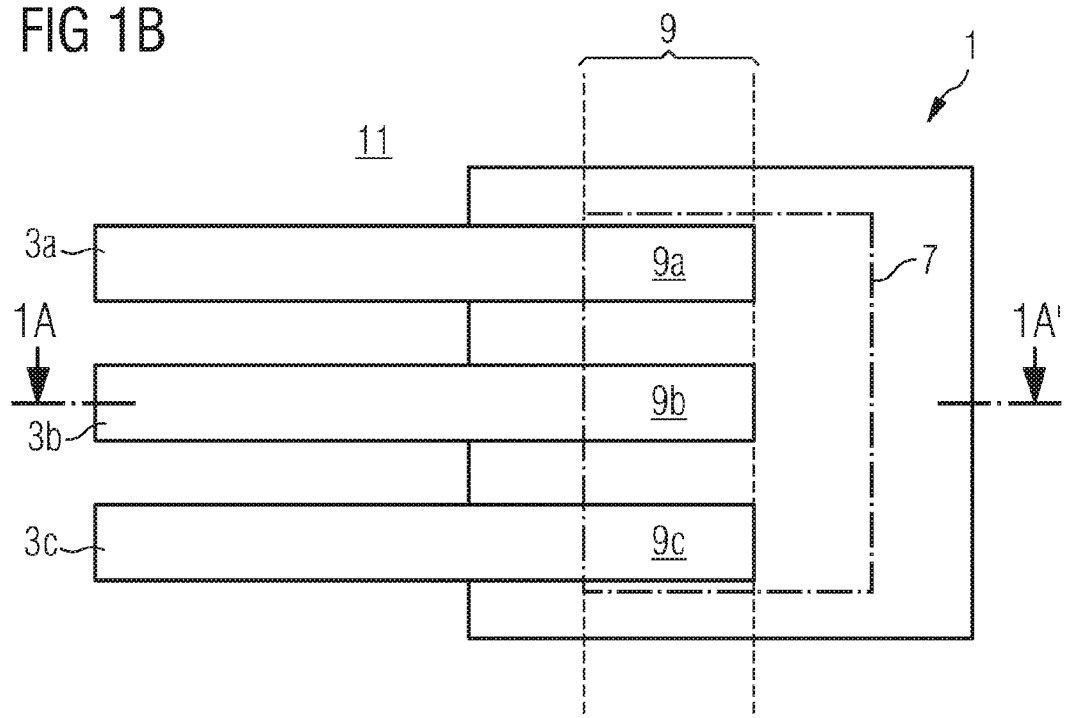

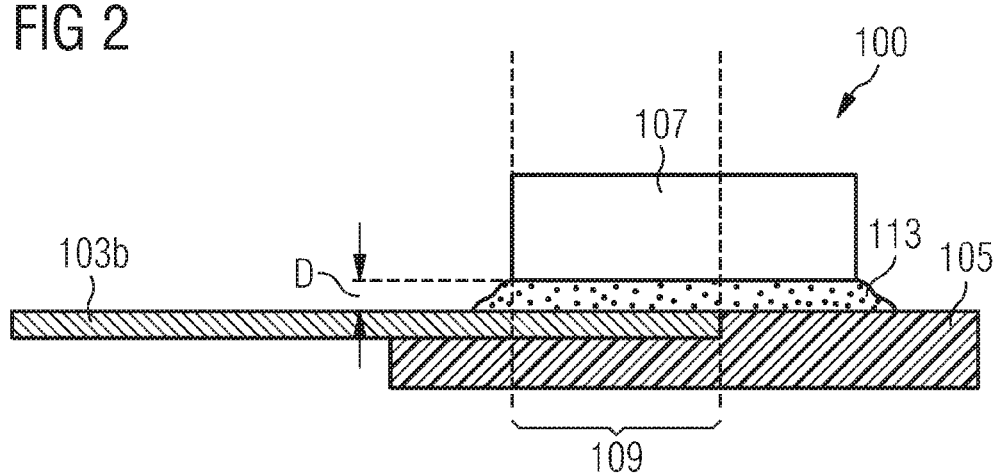
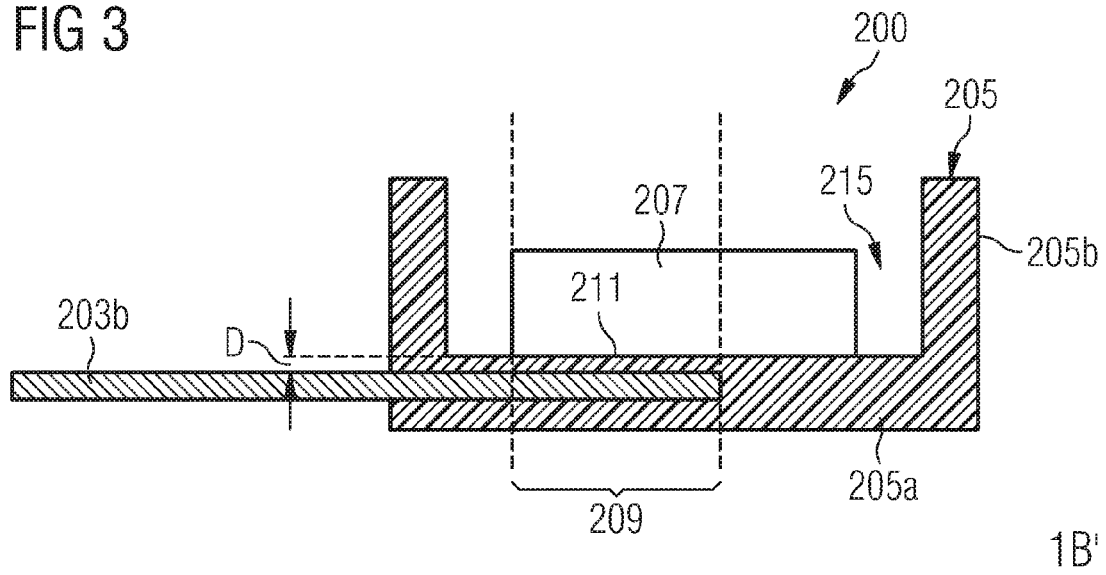

SEMICONDUCTOR DEVICE

FIELD OF THE INVENTION

The present invention relates to a semiconductor device and a method of manufacturing such semiconductor device.

BACKGROUND

In the wake of increasing levels of function integration in semiconductor devices, the need to dissipate heat generated in the semiconductor devices more efficiently is pressing. At the same time, there is a demand to improve reliability, reduce size, and to decrease manufacturing costs. Many of the objectives can be met by improving the way in which semiconductor chips are packaged.

SUMMARY

Accordingly, there is provided a semiconductor device comprising multiple separate leads molded in a molded structure, and a chip attached to the molded structure over at least two of the multiple separate leads.

BRIEF DESCRIPTION OF THE DRAWINGS

FIGS. 1A-1B depict an embodiment of a semiconductor device comprising multiple leads molded in a molded structure, and a chip attached to the molded structure.

FIG. 2 depicts an embodiment of a semiconductor device comprising multiple separate leads molded in a molded structure, a chip attached to the molded structure by means of an adhesive.

FIG. 3 depicts an embodiment of a semiconductor device comprising multiple separate leads molded in a molded structure, and a cavity defined by the molded structure.

DETAILED DESCRIPTION

Figure 4A:
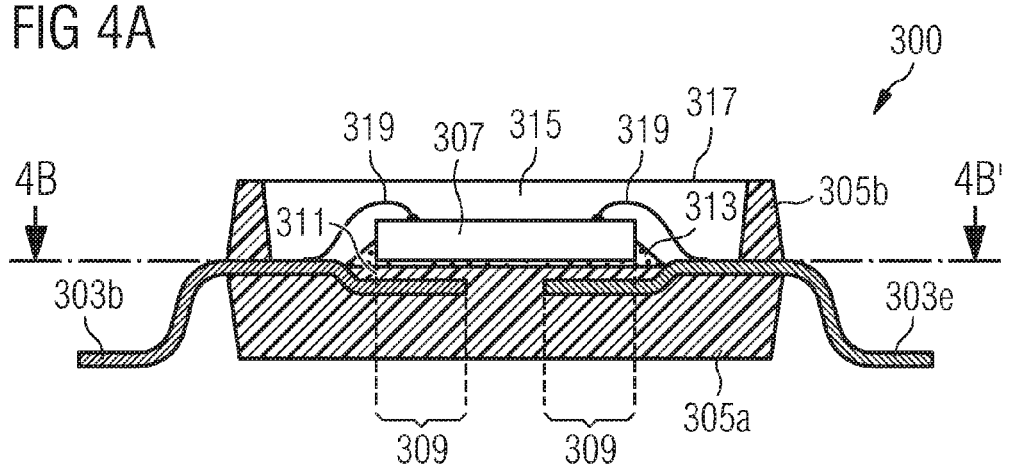
FIGS. 4A-4B depict an embodiment of a semiconductor device comprising multiple separate leads molded in a molded structure defining a cavity, a chip attached to the molded structure, and bond wires connecting the chip with the multiple separate leads within that cavity.

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 1A-1B schematically depict an embodiment of a semiconductor device 1 comprising multiple separate leads 3a, 3b, 3c molded in a molded structure 5, and a chip 7 attached to molded structure 5 over at least two of the multiple separate leads 3a, 3b, 3c. FIG. 1A illustrates a cross section of the semiconductor device 1 along line 1A-1A' shown in FIG. 1B while FIG. 1B discloses a cross section of the device 1 along line 1B-1B' shown in 1A in a plane orthogonal to the cross section of FIG. 1A. In FIG. 1B, chip 7 has been drawn with a dashed line since it is out of the plane defined by line 1B-1B'.

FIG. 1A-1B depict three separate leads 3a, 3b, 3c molded in a molded structure 5, and a chip 7 attached to molded structure 5. The number of the multiple separate leads 3a, 3b, 3c may be different from three. It may be any number larger than two depending on the application. The term "separate" refers to the fact that the multiple separate leads 3a, 3b, 3c are electrically disconnected from each other. In one embodiment, multiple separate leads 3a, 3b, 3c may have been integral with a leadframe (or with a leadframe strip consisting of an array of leadframes) until they were cut off from that leadframe (or leadframe strip) after molding. The use of leadframes is practical since it may hold a large array of leads in position until the molded structure can take over holding the leads.

The multiple separate leads 3a, 3b, 3c may be used as external contacts for receiving voltages or currents from the outside to chip 7, or for receiving voltages or currents from chip 7 to the outside. The multiple separate leads 3a, 3b, 3c may also serve as mechanical support for holding chip 7 in place with respect to a board or substrate to which the multiple separate leads are attached. For example, in one embodiment, the multiple separate leads 3a, 3b, 3c may be part of a through-hole device (THD) where the multiple separate leads 3a, 3b, 3c are inserted through through-holes of a printed circuit board, and subsequently soldered thereto. In another embodiment, the multiple separate leads 3a, 3b, 3c may be part of a surface-mount device (SMD) where the multiple separate leads 3a, 3b, 3c are soldered to the surface of a printed circuit board, without inserting the leads through a through-hole.

Molded structure 5 may have any shape depending on the application. The shape of molded structure 5 is usually determined by the shape of the mold form in which molded structure 5 has been molded. Molding is usually carried out by filling liquid mold material into a closed two-part mold form under pressure. After solidification of the liquid mold material in the mold form, the two parts of the two-part mold form are taken apart to remove the molded device.

In one embodiment, liquid mold material may be a simple polymer. In another embodiment, liquid mold material may be a duroplast epoxy resin filled with a filler material (e.g. 70-90 weight-% silicon oxide) and an organic hardener (e.g. 5-25 weight-%). For liquidizing, the mold material is heated to a temperature of, say, 180° C. Solidification occurs by letting the liquidized polymer cool down to, say, room temperature.

In the embodiment, molded structure 5 is a cuboid (see FIG. 1A-1B) having a defined thickness, a length and a width. In one embodiment, length and width of the cuboid are adapted to be as large or larger than length and width of the chip 7 that is to be attached to molded structure 5. In this case, the main surface of molded structure 5 can fully receive chip 7. For example, if the chip has an area given by a chip length of 2 mm and a chip width of 1 mm, molded structure 5 may have a length of 2.5 mm and a width of 1.5 mm.

In one embodiment, the multiple separate leads 3a, 3b, 3c are molded in molded structure 5 by inserting sections of the multiple separate leads 3a, 3b, 3c into the mold cavity before liquid mold material is filled into the mold cavity. In this case, the mold material can flow around the inserted sections of the multiple separate leads 3 so that it interlocks with the multiple separate leads 3a, 3b, 3c after mold material solidification. This way, solidified molded structure 5 can hold the multiple separate leads 3a, 3b, 3c in position with respect to each other.

FIG. 1A further depicts chip 7 as being attached to molded structure 5 over three separate leads 3a, 3b, 3c. Chip 7 may be a semiconductor chip, e.g. a silicon chip. In one embodiment, chip 7 may comprise an integrated circuit. In one embodiment, chip 7 may comprise a sensor, e.g. a membrane for sensing pressure or acoustic signals, photo-sensor for detecting light, a gas sensor for detecting a gas component, and the like. In one embodiment, chip 7 may comprise a light emitting component, e.g. a laser diode.

FIGS. 1A-1B depict that chip 7 is over molded structure 5, i.e. multiple separate leads 3a, 3b, 3c overlap in an overlap region 9 at least partially with chip 7 in a projection orthogonal to the chip main plane. In FIG. 1A-1B, overlap region 9 consists of the three separated overlap region segments 9a, 9b, 9c.

FIGS. 1A-1B further depict a molded insulating layer 11 defined by the molded layer that separates chip 7 from the multiple separate leads 3a, 3b, 3c. The thickness D of molded insulating layer 11 defines the minimum distance between chip 7 and the respective multiple separate leads 3a, 3b, 3c. The smaller thickness D, the better the heat dissipation from chip 7 to the multiple separate leads 3a, 3b, 3c. For example, for obtaining good heat dissipation from chip 7 to multiple separate leads 3a, 3b, 3c, thickness D can be made smaller than, e.g., 1000 micrometer. In one embodiment, molded insulating layer 11 may have a thickness D of 100 micrometer, or even smaller. On the other hand, a lower thickness limit may be given by a maximum voltage between multiple separate leads 3a, 3b, 3c and chip 7 that molded insulating layer 11 has to withstand during device operation. For example, to withstand a voltage of 10 V, a molded insulating layer 11 made of a duroplast epoxy resin should be thicker than 10 micrometer. Of course, an optimum thickness D depends on the application, the type of mold material, and the geometrical shape of the molded structure and the leads. Accordingly, thickness D may vary broadly.

FIG. 2 schematically depicts an embodiment of a semiconductor device 100 that may similar to the embodiment of FIGS. 1A-1B. For example, chip 107, multiple separate leads 103a, 103b, 103c (only lead 103b is shown in FIG. 2), and overlap region 109 may be identical to chip 7, multiple separate leads 3a, 3b, 3c and overlap region 9 of FIGS. 1A-1B. However, different from the disclosure in FIGS. 1A-1B, FIG. 2 indicates that chip 107 is attached to molded structure 105 by means of an adhesive insulating layer 113 having a thickness D. Adhesive insulating layer 113 separates chip 107 from the multiple separate leads 103a, 103b, 103c. In this embodiment, adhesive insulating layer 113 may cover, or touch, one or several of the multiple separate leads 103a, 103b, 103c. The smaller thickness D of adhesive insulating layer 113, the better the heat transfer from chip 107 to the multiple separate leads 103a, 103b, 103c. In one embodiment, adhesive 113 is an electrically insulating adhesive, e.g. an epoxy, liquid crystal polymer (LCP), etc. If adhesive insulating layer 113 is made of an electrically insulating material, adhesive insulating layer 113 may serve two purposes, i.e. for electrically insulating chip 107 from the multiple separate leads 3a, 3b, 3c, and for fastening chip 107 to molded structure 105. In this case, no molded material is needed for electrically insulating chip 107 against multiple separate leads 103a, 103b, 103c. This makes it possible to have the distance D of adhesive insulating layer 113 be limited merely by the way in which adhesive insulating layer 113 is applied. Typical thicknesses may be in the range between 5 to 250 micrometer, e.g., 10 micrometer.

FIG. 3 schematically depicts an embodiment of a semiconductor device 200 that may similar to the embodiment of FIGS. 1A-1B. For example, chip 207, multiple separate leads 203a, 203b, 203c (only lead 203b is shown in FIG. 3), overlap region 209, and molded insulating layer 211 of thickness D may be identical to chip 7, multiple separate leads 3a, 3b, 3c, overlap region 9, and molded insulating layer 11 of FIGS. 1A-1B.

On the other hand, different from the disclosure in FIGS. 1A-1B, molded structure 205 is shaped to define a cavity 215, and chip 207 is attached to molded structure 205 in that cavity. In FIG. 3, cavity 215 is defined by a base portion 205a to which chip 207 is attached, and a wall portion 205b that surrounds chip 207 to protect chip 207. Like in the previous embodiments, chip 207 may be attached to molded structure 205 by means of a glue or adhering layer.

In one embodiment, wall portion 205b may also serve as a base for a lid (not shown in FIG. 3) that may be placed on top of wall portion 205b to form a hermetically sealed cavity around chip 207. In this case, the height of wall portion 205b may be higher than the thickness of the chip. For example, if the thickness of chip 207 is 500 micrometer, the height of wall portion 205b may be 1000 micrometer to allow for a flat lid, and for wire bonds connecting the chip to the multiple separate leads 203a, 203b, 203c. With a lid sealing cavity 215, chip 207 can be protected against mechanical and chemical environmental stress. A hermetically sealed cavity may be useful when delicate bond wires are used to connect chip 207 to the multiple separate leads 203a, 203b, 203c, and when the bond wires have to be protected against mechanical destruction.

A hermetically sealed cavity may also be useful where molding a chip into mold material is prohibitive due to the high mechanical stress caused on the chip by the extended interface between the embedded chip and the embedding molded structure. For example, semiconductor chips comprising integrated circuits, pressure sensors, acceleration sensor, magnetic sensors, gas sensors or other sensors may be susceptible to mechanical stress caused at the interface with the mold material and, therefore, are often placed into a cavity instead.

Figure 4B:
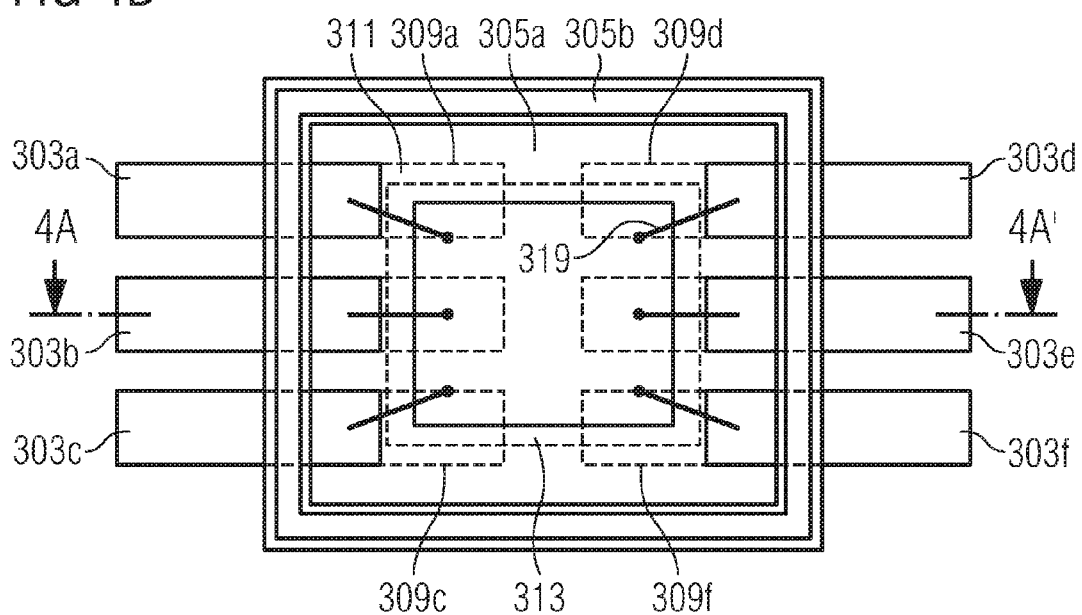

FIG. 4A-4B schematically depict an embodiment of a semiconductor device 300 having six separate leads 303a, 303b, 303c, 303d, 303e, 303e, 303f molded in a molded structure 305. Molded structure 305 consists of a base portion 305a and a wall portion 305b to define a cavity 315. Further, a chip 307 is attached in cavity 315 to base portion 305a over the six separate leads 303a, 303b, 303c, 303d, 303e, 303e, 303f. FIG. 4A illustrates the cross section of the semiconductor device 300 along line 4A-4A' shown in FIG. 4B while FIG. 4B discloses a cross section of the semiconductor device 300 along line 4B-4B' shown in 4A in a plane orthogonal to the cross section of FIG. 4A.

FIGS. 4A-4B depict that chip 307 is attached with an electrically insulating glue forming an adhering insulating layer 313 between chip 307 and base portion 305a. The thickness of adhering insulating layer 313 may be in the range of 5 to 250 micrometer, e.g., typically 10 micrometer. FIGS. 4A-4B further discloses an overlap region 309 consisting of six overlapping region segments 309a, 309b, 309c, 309d, 309e, 309f. Further, FIGS. 4A-4B disclose molded insulating layer 311 between adhering insulating layer 313 and multiple separate leads 303a-303f within overlap region 309. The thickness of molded insulating layer 311 may be in the range of, e.g., 100 micrometer, depending on chip and mold material. Adhering insulating layer 313 and molded insulating layer 311 combined represent an insulating layer that on the one hand is thick enough to ensure a given minimum electrical breakthrough-voltage and, on the other hand, is thin enough to allow heat to dissipate efficiently from chip 307 to the six separate leads 303a-f. Since chip 307 is attached over all six separate leads 303a-f, all six leads may be equally involved in dissipating the heat away to the board to which the six separate leads of semiconductor device 300 are soldered.

FIGS. 4A-4B further depict that the six separate leads 303a-f are bended upwardly to become visible from within cavity 315. This is to provide an area within cavity 315 where connecting elements 319, e.g. bond wires, can be connected to the leads for electrically connecting chip 307 with the respective six separate leads 303a-f. In one embodiments, the connecting elements 319 are bond wires; however, other connecting elements, like bond ribbon, clips, etc. can be used as well.

FIGS. 4A-4B further depict that the six separate leads 303a-f are fed through wall portion 305b to extend to the outside of the package. In the embodiment of FIGS. 4A-4B, the six separate leads 303a-f are bent twice in opposite directions at the outside to obtain gull wing shaped leads that can be soldered on the surface of a printed circuit board. Of course, the leads may be bended in other ways as well, or not bended at all, depending on the application.

FIG. 4A further depicts a lid 317 abutting with the upper rim of wall portion 305b to hermetically seal cavity 315. Lid 317 is a flat cover that is attached to the rim of wall portion 305b after chip 307 has been glued to base portion 305a, and after bond wires 319 have been used to connect chip 307 with the leads 303a-f within cavity 315. With lid 317 attached to wall portion 305b of molded structure 305, cavity 315 is hermetically sealed to protect chip 307 against mechanical or chemically harming environments.

Not shown in FIGS. 4A-4B is that chip 307 may be covered with a gel-like substance. Due to the soft consistency of a gel, a gel may be used to protect the delicate surface of the chip without causing stress to the chip's surface. A gel may be used, for example, when protecting the delicate membrane of a silicon microphone or silicon pressure sensor.

Although specific embodiments have been illustrated and described herein, it will be appreciated by those of ordinary skill in the art that a variety of alternate and/or equivalent implementations may be substituted for the specific embodiments shown and described without departing from the scope of the present invention.

For example, while the embodiments illustrated herein disclose multiple separate leads with three or six separate leads, semiconductor devices may have two, four, five, seven, ten or even hundreds of separate leads without deviating from the scope of the invention.

Further, while the embodiments illustrated herein disclose chips that are over all of the multiple separate leads, it is well within the scope of the invention that the chip 7 is only over two, or a fraction of the total number of separate leads.

Further, while in the embodiments illustrated herein mention that the lid is to hermetically seal the respective cavity, the lid may as well have one or several openings, depending on the application. For example, if the chip comprises a pressure sensor, or microphone, the lid may have one or several openings in order for the chip to have access to the environmental pressure or the acoustic waves outside the cavity.

Generally, this application is intended to cover any adaptations or variations of the specific embodiments discussed herein. One example of a variation is a half-bridge configuration including two freewheeling diodes, connected parallel to the first and to the second power transistor each. Therefore, it is intended that this invention be limited only by the claims and the equivalents thereof.

What is claimed is:

1. A semiconductor device, comprising:
   multiple separate leads molded in a molded structure; and
   a chip attached to the molded structure, wherein the molded structure comprises:
   a molded insulating layer composed of mold material disposed over a portion of the at least two of the multiple separate leads, and
   an adhesive insulating layer composed of adhesive disposed over the molded insulating layer,
   wherein at least a portion of the chip is disposed over the adhesive insulating layer, the molded insulating layer, and a portion of at least two of the multiple separate leads.

2. The semiconductor device according to claim 1 wherein the chip is electrically insulated from the at least two of the multiple separate leads by the adhesive insulating layer.

3. The semiconductor device according to claim 1 wherein the molded insulating layer and the adhering insulating layer have a combined thickness for a given minimum electrical breakthrough voltage and heat dissipation from the chip to the at least two of the multiple separate leads.

4. The semiconductor device according to claim 1 wherein the molded structure defines a cavity and wherein the chip is attached to the molded structure in the cavity.

5. The semiconductor device according to claim 1 further comprising connecting elements electrically connecting the multiple separate leads with the chip.

6. The semiconductor device according to claim 5 wherein the connecting elements are at least one of a bond wire, a ribbon, and a clip.

7. The semiconductor device according to claim 1 wherein the chip comprises a sensor.

8. The semiconductor device according to claim 1 wherein the chip is covered with a gel-like substance.

9. The semiconductor device according to claim 1 wherein the chip is attached over all of the multiple separate leads.

10. The semiconductor device according to claim 1 wherein the multiple separate leads are formed for surface mounting the semiconductor device to a board.

11. A semiconductor device, comprising:
   multiple separate leads molded in a molded structure, the molded structure defining a cavity;
   a chip attached to the molded structure in the cavity over a portion of at least two of the multiple separate leads, wherein the molded structure comprising:
   a molded insulating layer composed of a mold material disposed over a portion of the at least two of the multiple separate leads,
   an adhering insulating layer composed of adhesive disposed over the molded insulating layer,
   wherein at least a portion of the chip is disposed over the adhesive insulating layer, the molded insulating layer, and the portion of at least two of the multiple separate leads; and
   bond wires electrically connecting the multiple separate leads with the chip.

12. A method of manufacturing a semiconductor device, comprising:
   providing multiple separate leads molded in a molded structure wherein the molded structure defines a cavity;
   attaching a chip to the molded structure in the cavity;
   providing a molded insulating layer composed of a mold material in the molded structure;

disposing an adhesive layer over the molded insulating layer;

disposing at least a portion of the chip over the molded insulating layer, the adhesive layer, and a portion of at least two of the multiple separate leads; and electrically connecting the chip with the at least two of the multiple separate leads.

13. The semiconductor device of claim 1, wherein thickness of the molded insulating layer is about 10 micrometers to about 100 micrometers.

14. The semiconductor device of claim 1, wherein thickness of the adhesive insulating layer is about 5 to about 250 micrometer.

15. The semiconductor device of claim 1, further comprising:

wherein the molded insulating layer and the adhering insulating layer have a combined thickness of less than about 1000 micrometer.

16. The semiconductor device method of claim 11, wherein the adhesive insulating layer and the molded insulating layer form a composite insulating laser having a thickness sufficient for a breakthrough voltage and heat dissipation from the chip to the at least two of the multiple separate leads.

17. The semiconductor device of claim 11, further comprising:

wherein the adhesive insulating layer and the molded insulating layer have a combined thickness of less than about 1000 micrometers.

* * * * *

UNITED STATES PATENT AND TRADEMARK OFFICE
CERTIFICATE OF CORRECTION

| | | |
|---|---|---|
| PATENT NO. | : 7,868,430 B2 | Page 1 of 1 |
| APPLICATION NO. | : 12/238468 | |
| DATED | : January 11, 2011 | |
| INVENTOR(S) | : Paulus et al. | |

It is certified that error appears in the above-identified patent and that said Letters Patent is hereby corrected as shown below:

Column 8 line 6 Claim 16, the text "laser" should read --layer--.

Signed and Sealed this
Eighth Day of March, 2011

David J. Kappos
*Director of the United States Patent and Trademark Office*